April 20, 1965 R. D. VERNOT ETAL 3,179,813
POLARITY SELECTIVE GATE CIRCUIT
Filed Oct. 16, 1961
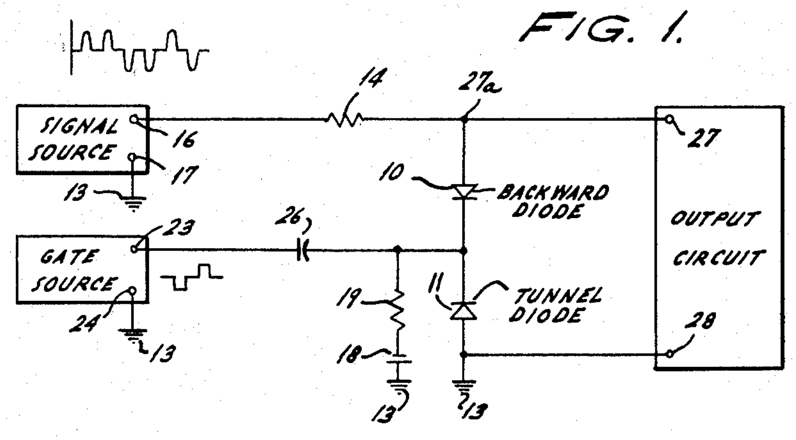
FIG. 1.
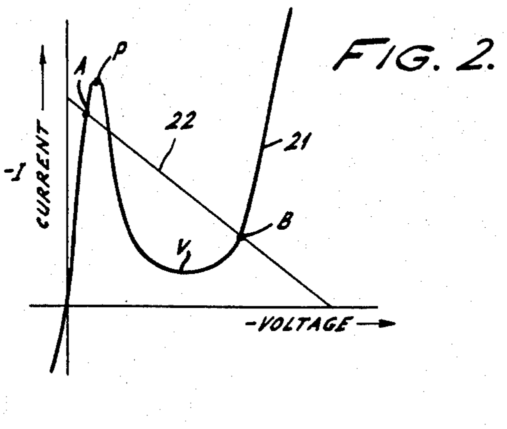
FIG. 2.
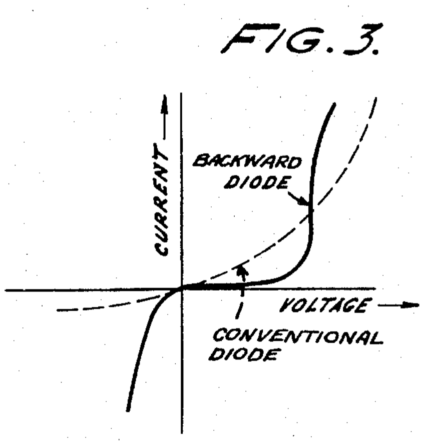
FIG. 3.
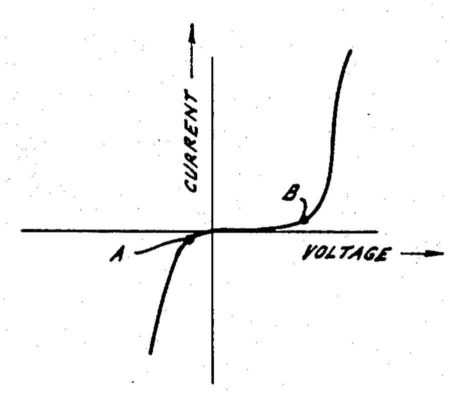
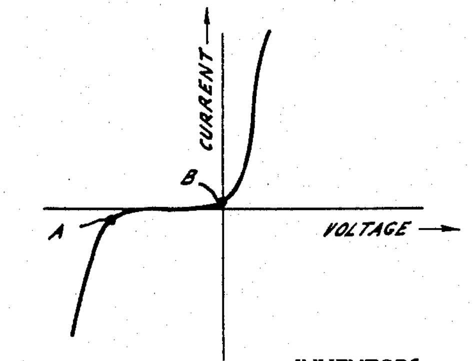
FIG. 4. FIG. 5.
INVENTORS
ROBERT D. VERNOT
RAYMOND J. Mc ARTHUR
BY Victor R. Beckman
ATTORNEY United States Patent Office 3,179,813
Patented Apr. 20, 1965

3,179,813
POLARITY SELECTIVE GATE CIRCUIT

Robert D. Vernot, Philadelphia, Pa., and Raymond J. McArthur, Syracuse, N.Y., assignors, by mesne assignments, to Philco Corporation, Philadelphia, Pa., a corporation of Delaware Filed Oct. 16, 1961, Ser. No. 145,346
5 Claims. (Cl. 307—88.5)

This invention relates to a gate circuit and more particularly to a polarity selective gate with memory capability.

Gate circuits embodying this invention employ semiconductor devices including a tunnel, or Esaki, diode in series circuit arrangement with a backward diode. Both the tunnel diode and backward diode comprise heavily doped, degenerate p and n type semiconductors forming a single p-n junction. The tunnel diode exhibits a negative-resistance portion in the low forward voltage range of the current-voltage characteristic. In the reverse voltage operating range of the tunnel diode a lower voltage drop obtains at a given current flow therethrough than with a conventional diode operating in the forward direction. A backward diode comprises, essentially, a tunnel diode having a peak current approaching zero.

The gate circuit of this invention, employing a tunnel diode and a backward diode, is capable of operating at very high speed and requires only a few components. Digital logic circuits, such as the gate of this invention, find many applications in computer and telemeter systems.

An object of this invention is the provision of an improved gate circuit which includes a minimum of components and which is capable of operation at high speeds.

An object of this invention is the provision of a tunnel diode gate circuit which remains in either one of two stable voltage states depending upon the polarity of a gating, or control, pulse applied thereto, whereby either negative- or positive-going signal pulses pass through the gate depending upon the voltage state of the tunnel diode.

These and other objects and advantages of the invention will become apparent from the following description when taken with the accompanying drawings. In the drawings, wherein like reference numerals denote like parts in the several views:

FIGURE 1 is a schematic circuit diagram of a gate circuit embodying this invention;

FIGURE 2 is a curve illustrating a typical current-voltage characteristic of a tunnel diode;

FIGURE 3 is a curve illustrating typical current-voltage characteristics of a backward diode and a conventional diode;

FIGURE 4 is a curve illustrating the composite current-voltage characteristic looking across the signal source input terminals with the tunnel diode in its low-voltage stage; and FIGURE 5 is similar to FIGURE 4 only showing the composite curve with the tunnel diode in its high-voltage state.

Reference is first made to FIGURE 1 of the drawings wherein there is shown a gate circuit comprising a backward diode 10 connected in series circuit with a tunnel diode 11; with the tunnel diode anode being connected to ground, designated 13. An input signal source of positive- and/or negative-going pulses is adapted for connection across the series connected backward and tunnel diodes through a coupling resistor 14, the input signal source being connected to input terminals 16 and 17.

A negative supply source 18 is connected across the tunnel diode 11 through a load resistor 19. For bistable operation of the tunnel diode it is only necessary that the load line (formed by the voltage source 18 and load resistor 19) intersect the tunnel diode characteristic curve at two points where the said curve has a positive slope. Reference is now also made to FIGURE 2 of the drawings wherein a typical current-voltage characteristic curve, designated 21, of the tunnel diode 11 is shown. The conductance load line, designated 22, of the load resistor 19 and source 18 is superimposed on the tunnel diode characteristic, and is shown intersecting the tunnel diode characteristic curve at points A and B where the tunnel diode curve has a positive slope.

Switching of the tunnel diode 11 between the stable operating points A and B is effected by means of a source of gate, or control, pulses adapted for connection to terminals 23 and 24 of the circuit shown in FIGURE 1. The terminal 23 is connected to the junction between the backward diode 10 and tunnel diode 11 through a coupling capacitor 26, while the terminal 24 is directly connected to ground 13. Output terminals 27 and 28 are connected to the opposite ends of the series connected backward and tunnel diodes, with the terminal 27 being shown connected to the backward diode 10 and the terminal 28 shown connected to the tunnel diode 11 at ground 13.

As mentioned above, the backward diode has a lower voltage drop at a given current than a conventional diode. Reference is made to FIGURE 3 wherein typical characteristic curves of a backward and a conventional diode are shown for comparison. As used herein the term "forward" is applied to the direction in which the greater current normally flows in a conventional PN junction diode while the term "reverse" is applied to the direction in which the smaller curent normally flows in a conventional junction diode.

Switching of the tunnel diode between the high and low voltage operating points by means of gate, or control, pulses applied to the terminals 23 and 24 will first be described with reference to FIGURE 1 and the curves of FIGURE 2. Assume the tunnel diode 11 is operating at the low-voltage state at point A on the diode characteristic curve. A negative-going control pulse at the terminal 23 functions to momentarily increase the tunnel diode current to a value in excess of the peak current, designated by the reference character P in FIGURE 2. The tunnel diode switches through the unstable negative resistance area of the characteristic to the high-voltage stable point B and remains in the high-voltage state until switched back to the low-voltage state A. Similarly, the tunnel diode is switched from the high-voltage state B to the low-voltage state A by the application of a positive-going control pulse of sufficient magnitude to momentarily reduce the tunnel diode current to a value less than the valley current, designated by the reference character V, whereby the tunnel diode switches through the unstable negative resistance region to the low-voltage state until switched to the high-voltage state by application of a negative-going control pulse thereto. The voltage across the tunnel diode 11 depends upon the magnitude of the D.-C. source 18 and the size of the load resistor 19. In the low-voltage condition (point A in FIGURE 2) the voltage drop across the tunnel diode is very small, a typical value being 25 mv. In the high voltage condition (point B in FIGURE 2) the voltage drop across the tunnel diode is much larger, a typical value being 500 mv. The stable voltage across the tunnel diode serves as a bias on the backward diode 10, which bias will be either 25 mv. or 500 mv. in the above-mentioned typical case.

With the tunnel diode in the low-voltage state, the composite current-voltage characteristic curve of the series diode combination as seen across the terminals **27*a* and 13** appears as shown in FIGURE 4 of the drawings. The composite characteristic curve comprises, essentially, the characteristic curve of a backward diode with a D.-C.

bias potential applied thereto. The D.-C. bias has the effect of shifting the backward diode characteristic along the abscissa. In the low-voltage state of the tunnel diode, only a small bias voltage (of about 25 mv.) is applied to the backward diode, and the backward diode characteristic is, therefore, shown shifted only slightly to the left in FIGURE 4. It will be noted that to the left of the ordinate or current axis, the slope of the curve is very steep indicating a very small resistance. A negative-going input, therefore, sees this small resistance and is shunted therethrough to ground. In this manner the negative-going input signals are substantially completely attenuated, since substantially a short-circuit appears across the output terminals 27 and 28 upon receipt of such signals. To the right of the current axis (between the axis and point B) the slope of the curve is very small indicating a large resistance. A positive-going input, therefore, sees this large resistance and is developed thereacross. The voltage across the series-connected diodes comprises the output from the gate which is fed to the output circuit. In this manner the positive-going input signals pass through the gate and appear at the output terminals with very little attenuation. Thus, in the low-voltage state of the tunnel diode, negative-going input signals are attenuated while positive-going signals are passed through the gate. The circuit remains in this state until a negative-going gating pulse is applied to the terminals 23, 24 to thereby switch the tunnel diode into its high-voltage state in a manner described above. With the tunnel diode in its high-voltage state the composite current-voltage characteristic curve looking across the terminals 27*a* and 13 appears as shown in FIGURE 5 of the drawings. As in the curve of FIGURE 4, the composite characteristic curve of FIGURE 5 comprises, essentially, the characteristic curve of a backward diode with a D.-C. bias potential applied thereto. In FIGURE 5 the bias comprises the potential drop across the tunnel diode when in the high-voltage state (about 500 mv.). The backward diode characteristic is, therefore, shown shifted a substantial distance to the left along the voltage axis. It will be noted that to the right of the ordinate or current axis, the slope of the curve is very steep indicating a very small resistance. A positive-going input, therefore, sees this small resistance and is shunted therethrough to ground. In this manner the positive-going input signals are substantially completely attenuated, since a short-circuit appears across the output terminals 27 and 28 upon receipt of such signals. To the left of the current axis (between the axis and point A) the slope of the curve is very small indicating a large resistance. A negative-going input, therefore, sees this large resistance and is developed thereacross. As mentioned above, the voltage across the series-connected diodes comprises the output from the gate which is fed to the output circuit. In this manner the negative-going input signals pass through the gate and appear at the output terminals with very little attenuation. With present-day tunnel and backward diodes, the input signals to be gated are limited in amplitude to about $\pm 500$ mv.

While in the embodiment of FIG. 1 the backward diode 10 and the tunnel diode 12 have their cathodes interconnected, they may as well be connected with the polarities of both reversed (i.e. with their anodes interconnected), in which case the polarity of battery 18 also should be reversed.

The invention having now been described in detail in accordance with the requirements of the Patent Statutes, various changes and modifications will suggest themselves to those skilled in this art. For example, it will readily be apparent that the circuit will function to gate analog signals as well as pulses. The circuit can also be used as a simple on-off gate, if desired, by injecting an input signal which is always either above or below ground potential. It is intended that these and other such changes and modifications shall fall within the scope of the patent as recited in the following claims.

We claim:

1. A gate circuit for the gating of input signals comprising a backward diode and a tunnel diode connected in series circuit, each of said diodes having an anode electrode and a cathode electrode, and one of said electrodes of said backward diode being connected to the like one of said electrodes of said tunnel diode, means biasing the tunnel diode for bistable operation, a source of control pulses, means connecting the control pulse source across the tunnel diode for control of the operating state thereof, and means connecting the input signals across the series connected backward and tunnel diodes.

2. The invention as recited in claim 1 wherein the means connecting the input signals across the series connected backward and tunnel diodes comprises a coupling resistor in series circuit between a source of input signals and said series connected backward and tunnel diodes, and wherein said gate circuit additionally comprises an output terminal connected to the junction of said coupling resistor and said series connected backward and tunnel diodes.

3. The invention as recited in claim 1 wherein the said means biasing the tunnel diode for bistable operation comprises a series connected D.-C. source of supply and load resistor connected across the tunnel diode.

4. A gate circuit for gating of either pulse or analog input signals, the said circuit comprising a pair of input terminals, a pair of output terminals and a pair of gate control terminals, a series connected backward diode and tunnel diode connected across the said output terminals, each of said diodes having an anode electrode and a cathode electrode, and one of said electrodes of said backward diode being connected to the like one of said electrodes of said tunnel diode, means including a coupling resistor connecting the series connected backward and tunnel diodes across the input terminals, a D.-C. source of supply and series connected load resistor connected across the tunnel diode and biasing the same for bistable operation, and means including a capacitor connecting the tunnel diode across the gate control terminals.

5. The invention as recited in claim 4 including a source of gate control pulses of positive and negative polarity connected across the said gate control terminals.

References Cited in the file of this patent

"Tunnel Diode Manual," published by General Electric Co. (Copyright March 20, 1961, page 10.)

Pub.: "Tale of The Hoffman Uni-Tunnel Diode" by Hoffman Electronics Corp. Semiconductor Division. (Copyright December 1960. Page 41 relied on.)

ARTHUR GAUSS, *Primary Examiner.*

JOHN W. HUCKERT, *Examiner.*